United States Patent
Cs et al.

(10) Patent No.: US 8,912,787 B2
(45) Date of Patent: Dec. 16, 2014

(54) SYSTEM AND METHOD TO PROVIDE TALKING FEATURE AND INTERACTIVE VOICE MENU IN PHASING METERS

(75) Inventors: Adishesha Cs, Karnataka (IN); Edukondalu Yarlagadda, Karnataka (IN); Michael D. Berg, Carol Stream, IL (US)

(73) Assignee: Honeywell International, Inc., Morristown, NJ (US)

( * ) Notice: Subject to any disclaimer, the term of this patent is extended or adjusted under 35 U.S.C. 154(b) by 185 days.

(21) Appl. No.: 13/438,275

(22) Filed: Apr. 3, 2012

(65) Prior Publication Data

US 2013/0257414 A1    Oct. 3, 2013

(51) Int. Cl.
| | |
|---|---|
| G01R 1/06 | (2006.01) |
| G01R 31/04 | (2006.01) |
| G01R 1/067 | (2006.01) |
| G01R 1/07 | (2006.01) |
| G01K 1/02 | (2006.01) |
| G01R 15/16 | (2006.01) |
| G01R 31/02 | (2006.01) |
| G01R 1/20 | (2006.01) |
| H02H 3/04 | (2006.01) |

(52) U.S. Cl.
CPC .......... G01R 1/06777 (2013.01); G01R 31/041 (2013.01); G01R 1/07 (2013.01); G01K 1/024 (2013.01); *H02H 3/04* (2013.01); G01R 15/16 (2013.01)
USPC ............. 324/149; 324/72; 324/72.5; 324/126

(58) Field of Classification Search
CPC .... G01R 1/06777; G01R 31/041; G01R 1/07; G01R 15/16; H02H 3/04; G01K 1/024
USPC .......... 324/149, 99 D, 72.5, 103 P, 115, 457, 324/458, 72, 76, 55, 86, 107, 126, 116, 324/127; 340/870.01–870.09
See application file for complete search history.

(56) References Cited

U.S. PATENT DOCUMENTS

| | | | | |
|---|---|---|---|---|
| 3,392,334 | A * | 7/1968 | Bevins ......................... | 324/149 |
| 3,790,850 | A * | 2/1974 | Doane et al. .................... | 345/42 |
| 4,563,770 | A * | 1/1986 | Lemelson et al. ............ | 704/270 |
| 4,864,226 | A * | 9/1989 | Tachimoto et al. ........... | 324/157 |
| 5,136,234 | A * | 8/1992 | Shaw .............................. | 324/72 |
| 5,703,928 | A * | 12/1997 | Galloway et al. ............... | 379/21 |

(Continued)

OTHER PUBLICATIONS

Greenlee Textron, 2010 Volt-Tick Voltage Detector Instruction Manual, Copyright 2000.*

(Continued)

*Primary Examiner* — Huy Q Phan
*Assistant Examiner* — Raul Rios Russo
(74) *Attorney, Agent, or Firm* — Wood, Phillips, Katz, Clark & Mortimer

(57) ABSTRACT

A high voltage detection device comprises a probe comprising an electrode for sensing a high voltage electrical line. The electrode is connected in series with a resistor. A meter comprises a housing enclosing a control for measuring parameters of line voltage. The control comprises an input module for connection to the probe to develop a voltage signal. A signal processing module receives the voltage signal and determines parameters of line voltage and drives an audio module. The audio module provides an audio output representing the determined parameters of line voltage.

20 Claims, 6 Drawing Sheets

(56) References Cited

U.S. PATENT DOCUMENTS

| | | | |
|---|---|---|---|
| 6,445,175 B1* | 9/2002 | Estep et al. | 324/160 |
| 6,459,252 B1 | 10/2002 | Bierer | |
| 6,617,840 B2 | 9/2003 | Bierer | |
| 6,734,658 B1 | 5/2004 | Bierer | |
| 7,173,428 B2* | 2/2007 | Hurwicz | 324/424 |
| 7,336,063 B1 | 2/2008 | Bierer | |
| 7,746,051 B1* | 6/2010 | Buchanan et al. | 324/72.5 |
| 2003/0015626 A1* | 1/2003 | Wolf et al. | 246/187 A |
| 2007/0041560 A1* | 2/2007 | Turcotte | 379/230 |
| 2008/0048722 A1* | 2/2008 | Suzuki | 326/83 |
| 2012/0074928 A1* | 3/2012 | Cs et al. | 324/123 R |
| 2013/0069664 A1* | 3/2013 | Mogaveera | 324/457 |
| 2013/0069669 A1* | 3/2013 | Mogaveera | 324/555 |
| 2013/0119976 A1* | 5/2013 | Mogaveera | 324/149 |
| 2013/0154674 A1* | 6/2013 | Nagpal | 324/715 |

OTHER PUBLICATIONS

Elan, Easy Sound—EM56000 Series Tiny Controller-Based Voice Synthesizer, Nov. 10, 2000, pp. 1-11.*

* cited by examiner

Fig. 2
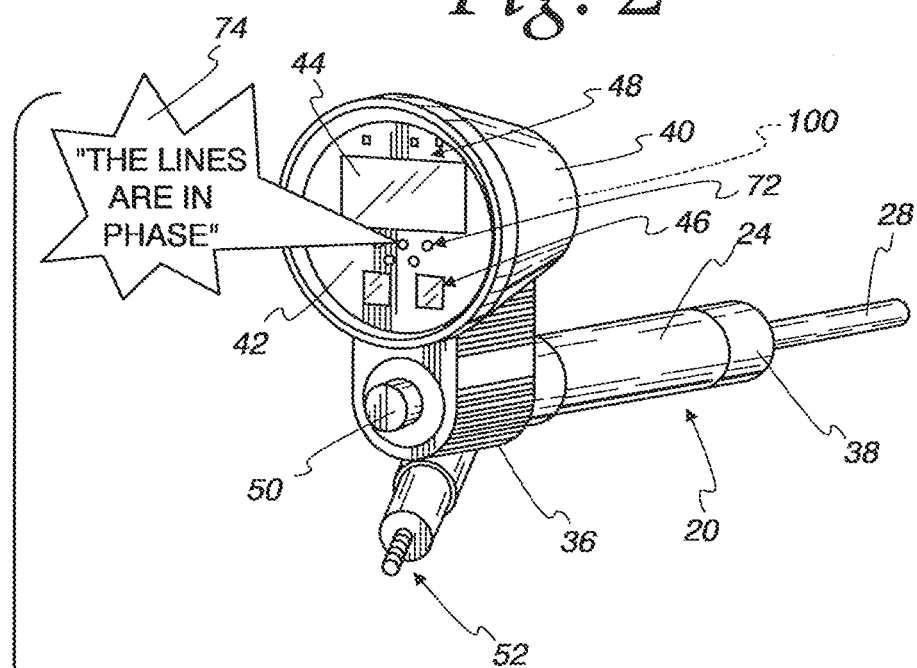
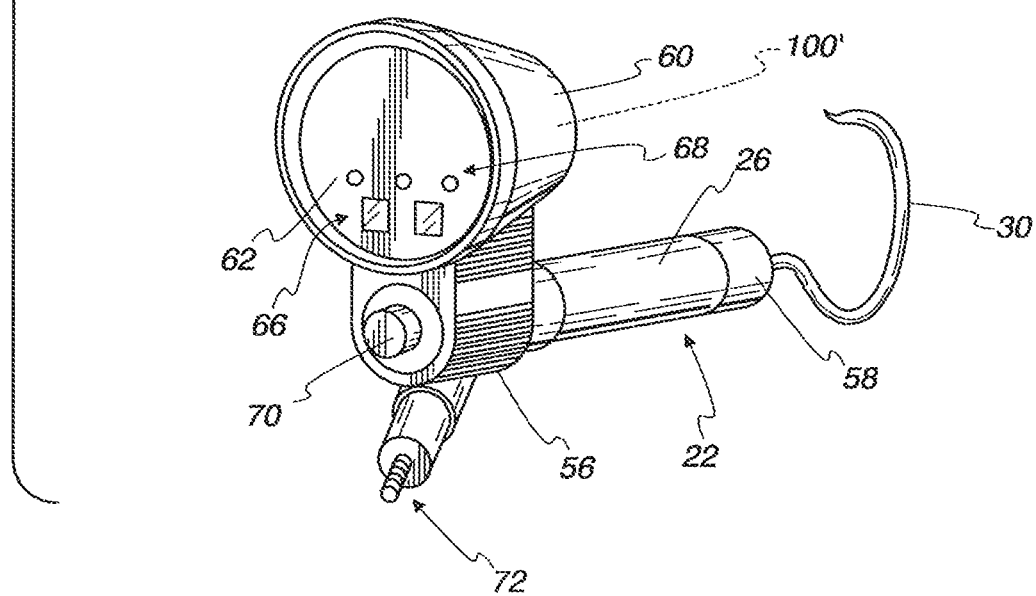

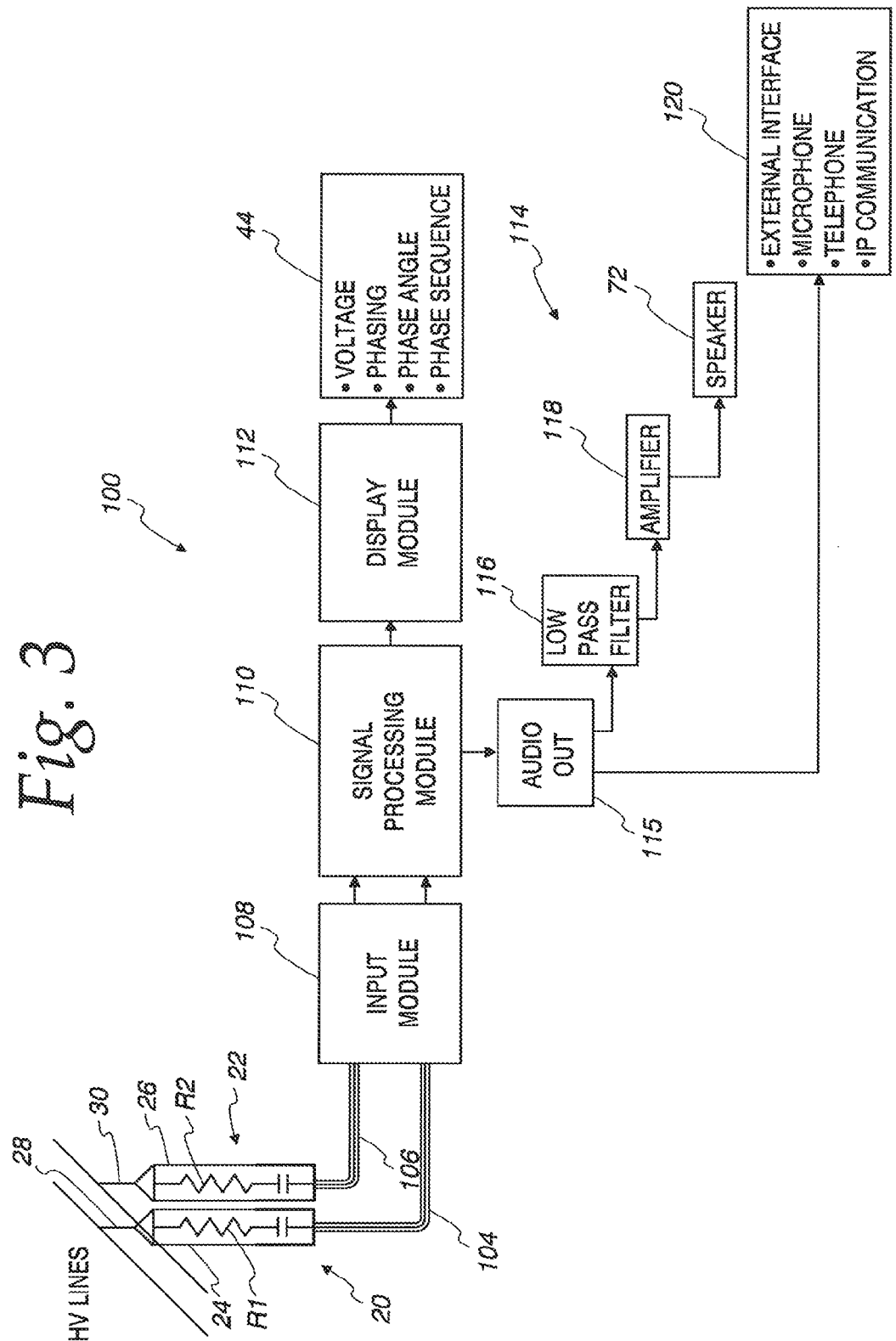

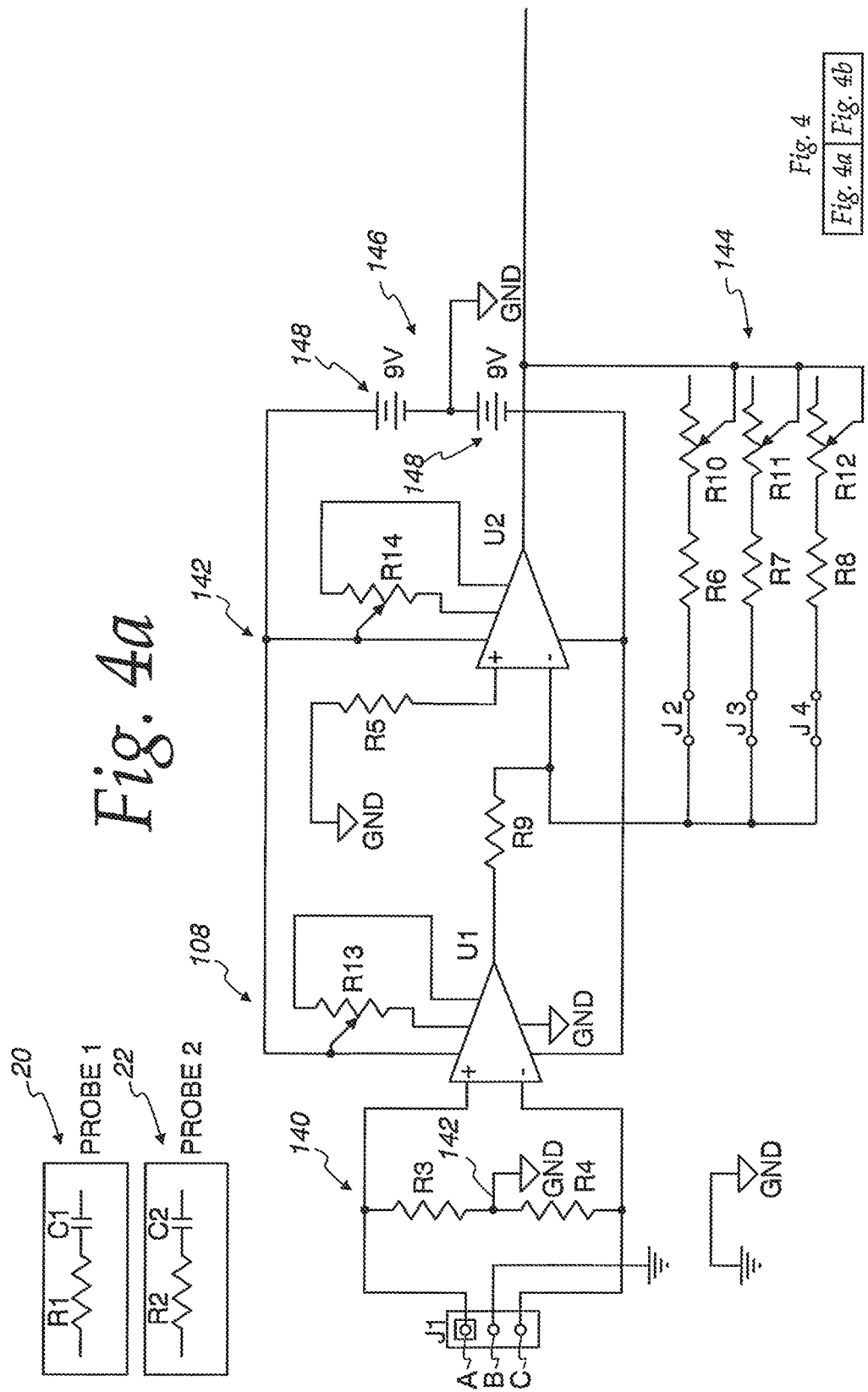

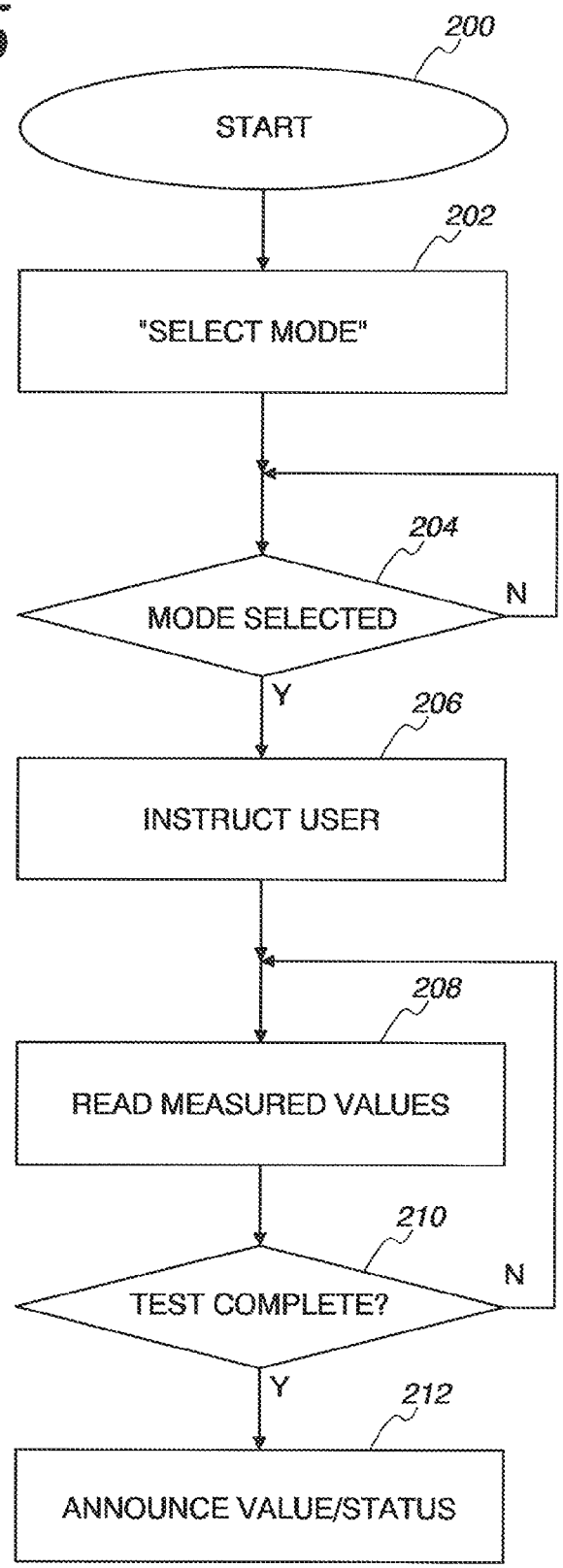

SYSTEM AND METHOD TO PROVIDE TALKING FEATURE AND INTERACTIVE VOICE MENU IN PHASING METERS

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

The disclosure relates generally to high voltage phasing voltmeters and more particularly, to providing noise free detection.

BACKGROUND

Electrical power distribution systems often include overhead electrical power distribution lines mounted upon poles by a wide variety of mounting structure. Other distribution systems include underground distribution lines in which protected cables run under the ground surface. It is often necessary to take phase-to-phase voltage measurements across transmission lines while testing for induced or live power lines or equipment.

Known high voltage safety line detectors, meters and testers comprise high resistance probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized. Known devices for providing such measurements include contact type and non-contact type. With contact type a reference probe or transmitter and a meter probe or receiver are connected in series with a cable as the loop is closed with load terminals.

Phasing and phase angle measurement on utility grid lines are critical for rapid load balancing, identifying faulty circuits, and maintenance of the grid lines. Even though feeder circuits are designed to be well balanced in the initial deployment, one of the phases may turn out to be more heavily loaded than others, leading to load imbalance conditions. Phasing meters facilitate the rebalancing of the phases and provide for rapid maintenance and restoration of clean grid systems in the field.

The probes need to be attached to hot sticks for reaching the overhead lines and to meet the safety requirements. The line workers hold the sticks and hook the meter to power lines for detection/measurement, as shown in FIG. 1. At times the workers are in difficult environments where inadequate lighting and the distance from the meter make it very difficult for reading the phasing meter. This can make it more difficult to read the status of the line voltage, phase angle and other parameters without looking at the meter. Even with the non-contact type meters the probes need to be read before and during maintenance.

To assist in various environments displays could be analog, digital or provide status indication using LED's. Known meters come with back light for increasing visibility. Digital displays make it easier to read the meter with minimal lighting. Color coded LEDs are used for status indication of the electrical lines. Buzzers may indicate over voltage status by generating beep sounds. Nevertheless, reaching nearby lines and reading at hazardous and hard environment remain an issue.

The present disclosure is directed to improvements in high voltage phasing meters.

SUMMARY

As described herein, a high voltage detection device provides an audio output.

Broadly, there is disclosed in accordance with one embodiment a high voltage detection device comprising a probe comprising an electrode for sensing a high voltage electrical line. The electrode is connected in series with a resistor. A meter comprises a housing enclosing a control for measuring parameters of line voltage. The control comprises an input module for connection to the probe to develop a voltage signal. A signal processing module receives the voltage signal and determines parameters of line voltage and drives an audio module. The audio module provides an audio output representing the determined parameters of line voltage.

It is a feature of the invention that the input module comprises a biasing circuit and comprises an amplifier circuit.

It is another feature that the audio module comprises a speaker. The audio module may also comprise a low pass filter connected to an amplifier.

It is another feature that the signal processing module comprises a processor operating in accordance with a control program to implement an interactive voice menu. The voice menu may prompt a user to select an operational mode and to use the probe according to a selected operational mode. The interactive voice menu may announce the determined parameters of the line voltage to the user.

It is another feature to provide an interface operatively associated with the audio module for communicating with external devices.

It is still another feature that the control comprises a battery powered circuit.

There is also disclosed a method of providing verbal communication in a high voltage detection device comprising: providing a probe comprising an electrode for contacting a high voltage electrical line, the electrode being connected in series with a resistor; and providing a meter comprising a control, the control comprising an input module for connection to the probe to develop a voltage signal, a signal processing module receiving the voltage signal and determining parameters of line voltage and driving an audio module, the audio module providing an audio output announcing the determined parameters of line voltage.

Other features and advantages will be apparent from a review of the entire specification, including the appended claims and drawings.

BRIEF DESCRIPTION OF THE DRAWINGS

FIG. 2 a perspective view of the high voltage phasing meter comprising a meter probe and a reference probe as disclosed herein;

FIG. 3 is a block diagram of a control circuit for the phasing meter of FIG. 2;

FIG. 4, including FIGS. 4a and 4b, is an electrical schematic of the control circuit for the phasing meter; and FIG. 5 is a flow diagram illustrating operation of a control program for the talking features and interactive voice menu used in the phasing meter of FIG. 2.

DETAILED DESCRIPTION

The phasing meter, detector or tester, referred to generally as a phasing meter, disclosed herein facilitates phasing measurements and phase sequencing without the operator looking at the meter. The phasing meter may be contact or non-contact type and/or cordless and have high resistive/resistive capacitive probes. One of the probes includes a control for meter measurement and display. The control is a microcontroller/processor based system. Firmware (processor software) in the microcontroller uses an algorithm to suggest the selected functional mode, detect and measure proportional voltage, phasing, phase angle and phase sequence among the three phase high voltage distribution grids. The control interfaces with an audio module including an integrated circuit, a low pass filter and an amplifier to drive a speaker. The measured parameters are announced by the audio module with a pre-defined voice pattern. The audio module could be interfaced with external communication devices such as a microphone, a telephone or an IP communication device to operate from a remote location and to improve the ease of operation.

This solution can be extended to all the high voltage line meter products used for detection, measurement, Indicating and display of voltage and phase attributes of AC systems.

Figure 1:
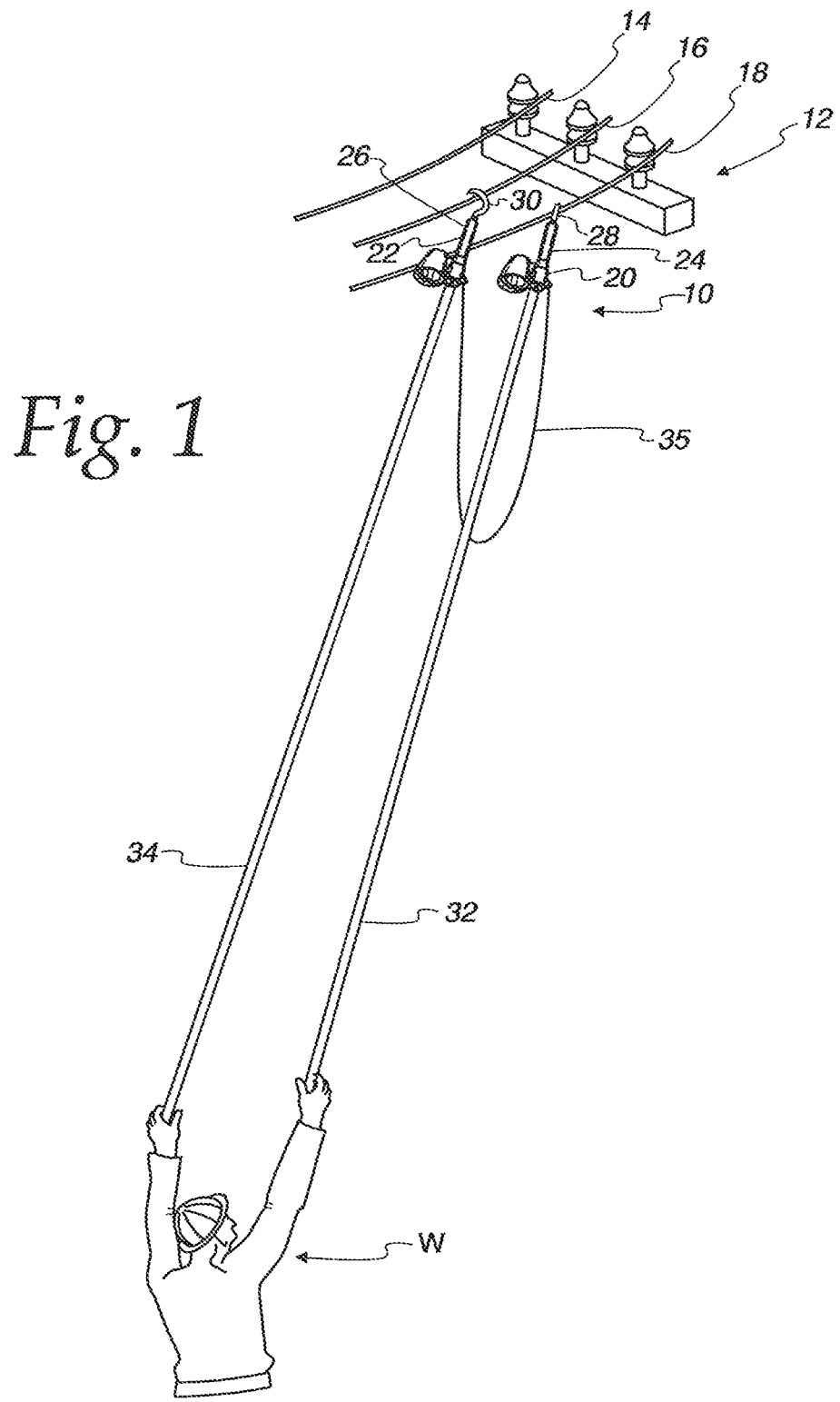
FIG. 1 is a perspective view of use of a high voltage phasing meter as described herein.

Referring initially to FIG. 1, a contact type high voltage phasing meter 10 is shown for measuring phase-to-phase voltage or voltage to ground between lines in a high voltage transmission line system 12. The transmission line system 12 includes three conductors 14, 16 and 18 carrying high voltage power of alternating current with each line being 120 degrees out of phase with the other lines, as is conventional. The phasing meter 10 may be used by a lineman or maintenance worker W for measuring voltage such as between the electrical conductors 16 and 18 as illustrated in FIG. 1. The phasing meter 10 may also be used to measure other voltages, such as phase to neutral, as is known.

The phasing meter 10 comprises a first probe 20, also known as a meter probe, and a second probe 22, also known as a reference probe, see also FIG. 2. The first probe 20 includes an elongate insulated shield 24 and a first electrode 28 extending from a distal end thereof. The second probe 22 includes an elongate insulated shield 26 a second electrode 30 extending from a distal end thereof. A first extension pole 32, known as a hot stick, is connected to the first probe insulated shield 24. A second extension pole 34 is connected to the second probe insulated shield 26. The extension poles 32 and 34 are of a select length to enable the maintenance worker W to extend the probes 20 and 22 to the transmission line system 12 so that the electrodes 28 and 30 contact select ones of the transmission line conductors 14, 16 and 18.

Referring specifically to FIG. 2, the meter probe 20 comprises the elongate cylindrical insulated shield 24 connected to a handle portion 36 at a near end and a terminal 38 at a distal end. The terminal 38 threadably receives the electrode 28. The electrode 28 can be a straight probe as shown, or a hook, such as the electrode 30, or a clamp, or the like, as necessary or desired. A housing 40 is integrally formed with the handle portion 36. The housing 40 is frustoconical in shape including a face plate 42 including a display 44 and operator input buttons 46 and LED display elements 48. The display 44 can be an analog display or a digital display. An adaptor 50 on the handle portion 36 is aligned with the shield 24 and is adapted to secure the hot stick 32 in a conventional manner. A connector 52 is used for connecting a cable 35, see FIG. 2.

The reference probe 22 comprises the elongate cylindrical insulated shield 26 connected to a handle portion 56 at a near end and a terminal 58 at a distal end. The terminal 58 threadably receives the electrode 30. The electrode 30 can be a hook as shown, or a straight probe, such as the electrode 28, or a clamp, or the like, as necessary or desired. A housing 60 is integrally formed with the handle portion 56. The housing 60 is frustoconical in shape including a face plate 62 including operator input buttons 66 and LED display elements 68. An adaptor 70 on the handle portion 56 is aligned with the shield 26 and is adapted to secure the hot stick 34 in a conventional manner. A connector 72 is used for connecting with the meter probe 20 using the cable 35.

As shown in FIG. 1, the lineman W can grip the extension poles 32 and 34 to contact the lines 16 and 18 with the respective electrodes 28 and 30. The meter display 44 is used to enable the lineman W to read the measured voltage across the terminals, or other parameters, as desired.

As described herein, the meter probe 20 includes a speaker 72 to provide audio for implementing an interactive voice menu and announcing measured parameters such as "The lines are in phase" as indicated at 74.

The meter probe 20 comprises a control circuit 100, illustrated in block diagram form in FIG. 3. The control circuit 100 is on a circuit board (not shown) internal to the housing 40. The reference probe 22 comprises an interface circuit 100'. The interface circuit 100' is on a circuit board (not shown) internal to the housing 60. The interface circuit 100' is used to electrically connect the reference probe 22 to the meter probe 20, which includes the control circuit 100. The control circuit 100 measures sensed voltage from either or both probes 20 and 22 for generating the required measurements and providing the necessary output, as will be apparent.

In use, the meter probe 20 either makes contact with the high voltage electrical line using the electrode 28 for voltage detection and phase angle measurement, or is brought in proximity to the high voltage electrical line for phase angle measurement only. The meter probe 20 includes a high voltage resistor R1. The high voltage resistor R1 is located in the shield 24 and is electrically connected in series with the electrode 28. The high voltage resistor R1 is connected to the control circuit 100 through a conductor 104.

Similarly, the reference probe 22 either makes contact with the high voltage electrical line using the electrode 30 for voltage detection and phase angle measurement, or is brought in proximity to the high voltage electrical line for phase angle measurement only. The reference probe 22 includes a high voltage resistor R2. The high voltage resistor R2 is located in the shield 26 and is electrically connected in series with the electrode 30. The high voltage resistor R2 is connected to the control circuit 100 through a conductor 106.

Referring to FIG. 3, the control circuit 100 includes an input module 108 connected to the probes 20 and 22. The input module develops a voltage signal representing voltage and phase characteristics sensed by the probes 20 and 22. A signal processing module 110 receives the voltage signal and determines parameters of the line voltage and drives a display module 112 and an audio module 114. The display module 112 develops display data for displaying parameters such as voltage, phasing, phase angle or phase sequencing on the display 44. The audio module 114 includes an audio output block 115 controlled by the signal processing module 110 to provides an audio output representing determined parameters of line voltage. The audio output block 115 develops an analog signal which is transferred through a low pass filter 116 and amplifier 118 to the speaker 72. The audio module 114 may also be connected to an interface module 120 to communicate the determined parameters of line voltage to an external device such as microphone, telephone or internet protocol (IP) communication device.

Referring to FIG. 4, a detailed schematic for the control circuit 100 is illustrated. A terminal block J1 is used for connection to the probes 20 and 22. The terminal block J1 includes a terminal A for connection to the meter probe 20 and a terminal C for connection to the reference probe 22. A terminal B connects the probe conductive coatings to ground.

The input module 108 comprises a biasing circuit 140 including resistors R3 and R4 connected in series across the terminal block A and C terminals. A center node 142 is connected to ground. The same terminals A and C are connected to the non-inverted and inverted inputs, respectively, of an instrumentation amplifier U1 of an amplifier circuit 142. The amplifier U1 may comprise a type AD620 low power instrumentation amplifier. A reference terminal is connected to ground with a potentiometer R13 operating as a gain resistance. The amplifier circuit 142 provides high common mode rejection. The output from the amplifier circuit 142 represents the voltage difference between the probes 20 and 22.

The output from the instrumentation amplifier U1 is connected via a resistor R9 to the inverted input of an operational amplifier U2. The operational amplifier U2 may comprise a type OP177 ultraprecision operational amplifier. The non-inverted input is connected via a resistor R5 to ground. A potentiometer R14 is connected as part of an offset nulling circuit. Active range selection is provided by a range selection circuit 144 connected between the output and, the inverting input to provide variable gain. The range selection circuit 144 consists of a series combination of a switch contact J2, a resistor R6 and potentiometer R10; in parallel with a series combination of a switch contact J3, a resistor R7 and potentiometer R11; and in parallel with a series combination of a switch contact J4, a resistor R8 and potentiometer R12. The output from the operational amplifier U2, which represents the amplified voltage difference between the probes 20 and 22, is connected to a microcontroller 146 of the signal processing module 110.

Each range is selected by closing one of the switch contacts J2, J3 or J4. The number of ranges that can be selected and the precise values of the ranges are arbitrary and can be determined as will be apparent to those skilled in the art. The positions of the switches J2, J3 and J4 can be controlled manually or electronically, as will be apparent to those skilled in the art. Which range is selected changes the gain of the amplifier 142.

The instrumentation amplifier circuit 142 comprises a unity following instrumentation amplifier with high common mode rejection to eliminate common mode parasitic noise effects, including stray capacitance, medium frequency harmonics at the high voltage lines and uncertainties due to unsymmetrical components in the probe. This provides active and robust compensation. The biasing circuit 140 and the operational amplifiers U1 and U2 are powered by a dual power supply regulator 146 which draws negligible input power from batteries 148.

The schematic diagram of FIG. 4 illustrates representative values for the resistors and capacitors. These values are for one example of a circuit. As is apparent, the precise values could be varied from those shown herein.

The signal processing module 110 comprises a microcontroller 146. The microcontroller in the illustrated embodiment comprises a type PIC 16F876-04USP microcontroller. As will be apparent, other types of microcontrollers could be used. The microcontroller 146 comprises a programmed processor and associated memory for analyzing the voltage signal from the operational amplifier U2 and is operable to measure parameters such as voltage, phasing, phase angle and phase sequencing. The audio output 115 comprises programmed functionality in the microcontroller 146 for generating an analog audio signal to implement the interactive voice menu and/or announcement of test results. The output is supplied through the low pass filter 116 comprising a resistor R2 and capacitor C5 to an amplifier consisting of transistor Q1 and potentiometer R18 to drive the speaker 72. The speaker is connected through a resistor R19. A capacitor C6 is across output nodes 148 and 50 which provide the external interface 120 for connection to external devices.

As will be apparent, other measurement and control circuitry could be utilized according to the particular test to be performed. The illustrated circuit is particularly directed to the aspect of providing talking features and interactive voice menus in phasing meters using audio outputs.

Figure 4B:
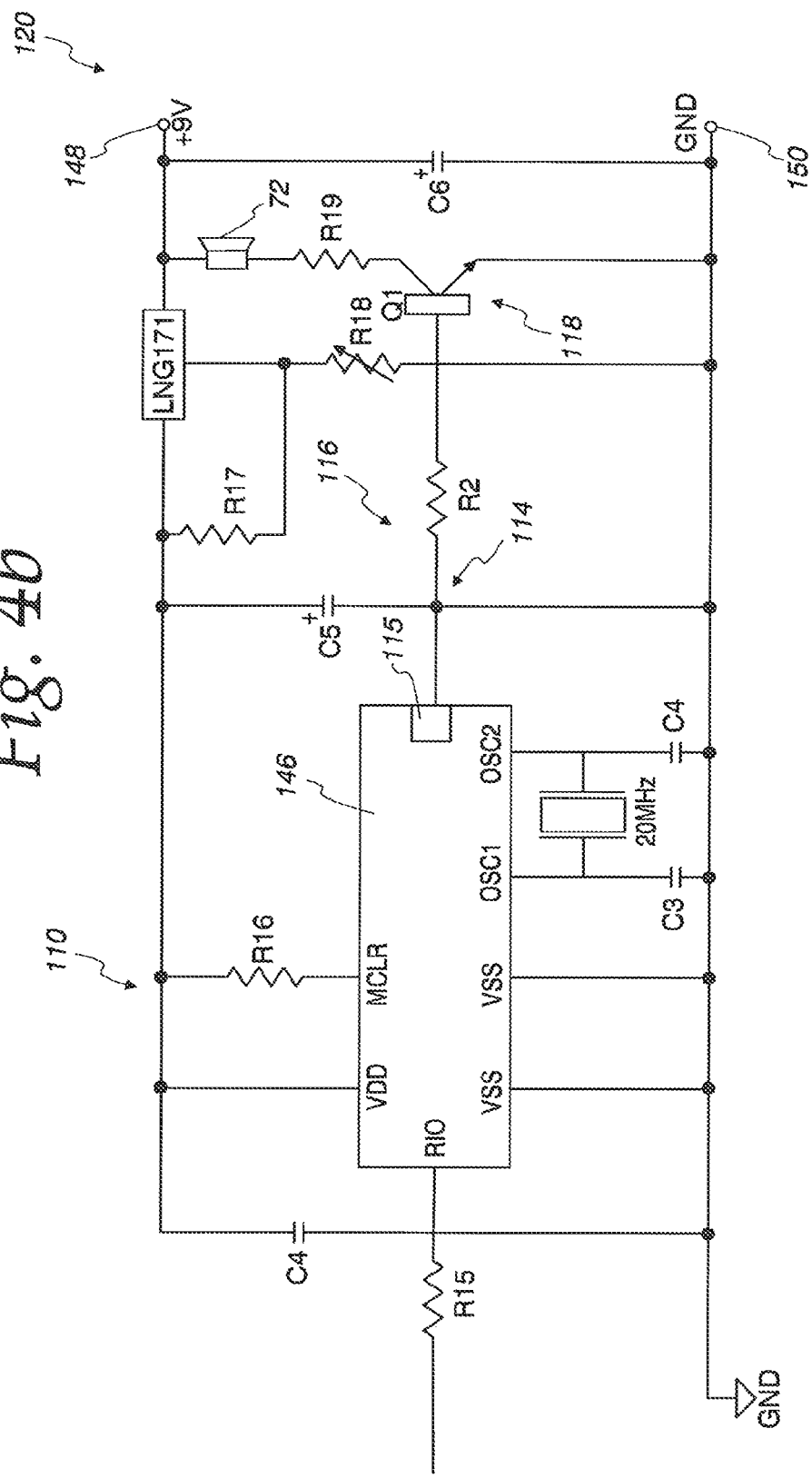

Referring to FIG. 5, a flow diagram illustrates the relevant portion of a program implemented in the microcontroller 146 of FIG. 4b for the audio features. This begins at a start node 200 when the phasing meter 10 is turned on. A block 202 generates an audio output to the speaker 72 instructing the user to "Select mode". The program waits at a decision block 204 for a mode to be selected such as by using the push buttons 46, see FIG. 2. Depending upon the mode selected, the phasing meter 10 instructs the user at a block 206. These instructions may be, for example, to position the electrodes 28 and/or 30 in contact or proximity to particular high voltage lines. The program reads the measured values at a block 208. This may be an interactive process where the user is instructed to perform multiple tasks. A decision block 210 determines if the test is complete. If not, control returns back to wait for measured values. Once the test is complete, then the values and/or status are announced over the speaker 72 at a block 212. The routine then ends, waiting to be restarted for a subsequent test.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other embodiments may be within the scope of the following claims.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The phasing meter has been described with respect to flowcharts and block diagrams. It will be understood that each block of the flowchart and block diagrams can be implemented by computer program instructions. These program instructions may be provided to a processor to produce a machine, such that the instructions which execute on the processor create means for implementing the functions specified in the blocks. The computer program instructions may be executed by a processor to cause a series of operational steps to be performed by the processor to produce a computer implemented process such that the instructions which execute on the processor provide steps for implementing the functions specified in the blocks. Accordingly, the illustrations support combinations of means for performing a specified function and combinations of steps for performing the specified functions. It will also be understood that each block and combination of blocks can be implemented by special purpose hardware-based systems which perform the specified functions or steps, or combinations of special purpose hardware and computer instructions.

The invention claimed is:

1. A high voltage detection device configured with verbal communication comprising:
 a probe comprising an elongate insulated shield having a handle portion with an electrode for sensing a high voltage electrical line extending from a distal end of the shield;
 an elongate extension pole connectable to the insulated shield the extension pole being of a select length to position the probe proximate the high voltage electrical line; and
 a meter comprising a housing secured to the handle portion and enclosing a control for measuring parameters of line voltage, the control comprising an input module for connection to the probe to develop a voltage signal, a signal processing module receiving the voltage signal and determining parameters of line voltage and driving an audio module, the audio module providing an audio output announcing the determined parameters of line voltage with a verbal announcement using a predefined voice pattern with the probe proximate the high voltage electrical line at a distance, approximately the select length of the pole, from a user.

2. The high voltage detection device of claim 1 further comprising a second probe comprising an elongate insulated shield having a handle portion with an electrode for sensing a second high voltage electrical line extending from a distal end of the shield, a second elongate extension pole connectable to the insulated shield the extension pole being of a select length to position the second probe proximate the second high voltage electrical line and the input module is operatively connected to the second probe to develop the voltage signal.

3. The high voltage detection device of claim 1 wherein the input module comprises an amplifier circuit.

4. The high voltage detection device of claim 1 wherein the audio module comprises a speaker.

5. The high voltage detection device of claim 1 wherein the audio module comprises a low pass filter connected to an amplifier.

6. The high voltage detection device of claim 1 wherein the signal processing module comprises a processor operating in accordance with a control program to implement an interactive voice menu.

7. The high voltage detection device of claim 6 wherein the signal processing module interactive voice menu prompts a user to select an operational mode and to use the probe according to a selected operational mode.

8. The high voltage detection device of claim 7 wherein the signal processing module interactive voice menu announces the determined parameters of line voltage to the user.

9. The high voltage detection device of claim 1 further comprising an interface operatively associated with the audio module for communicating with external device.

10. The high voltage detection device of claim 1 wherein the control comprises a battery powered circuit.

11. A method of providing verbal communication in a high voltage detection device comprising:
 providing a probe comprising an elongate insulated shield having a handle portion with an electrode for sensing a high voltage electrical line extending from a distal end of the shield, the electrode being connected in series with a resistor;
 connecting an elongate extension pole to the insulated shield the extension pole being of a select length to position the probe proximate the high voltage electrical line; and
 providing a meter comprising a control, the control comprising an input module for connection to the probe to develop a voltage signal, a signal processing module receiving the voltage signal and determining parameters of line voltage and driving an audio module, the audio module providing an audio output announcing the determined parameters of line voltage with a verbal announcement using a predefined voice pattern while the probe is proximate the high voltage electrical line at a distance, approximately the select length of the pole, from a user.

12. The method of providing verbal communication in a high voltage detection device of claim 11 further comprising providing a second probe comprising an elongate insulated shield having a handle portion with an electrode for sensing a second high voltage electrical line extending from a distal end of the shield, connecting a second elongate extension pole connectable to the second probe insulated shield, the extension pole being of a select length to position the second probe proximate the second high voltage electrical line and wherein the input module is operatively connected to the second probe to develop the voltage signal.

13. The method of providing verbal communication in a high voltage detection device of claim 11 wherein the input module amplifies the voltage signal.

14. The method of providing verbal communication in a high voltage detection device of claim 11 wherein the audio module comprises a speaker.

15. The method of providing verbal communication in a high voltage detection device of claim 11 wherein the audio module amplifies the audio output.

16. The method of providing verbal communication in a high voltage detection device of claim 11 wherein the signal processing module comprises a processor operating in accordance with a control program to implement an interactive voice menu.

17. The method of providing verbal communication in a high voltage detection device of claim 16 wherein the signal processing module interactive voice menu prompts a user to select an operational mode and to use the probe according to a selected operational mode.

18. The method of providing verbal communication in a high voltage detection device of claim 17 wherein the signal processing module interactive voice menu announces the determined parameters of line voltage to the user.

19. The method of providing verbal communication in a high voltage detection device of claim 11 further comprising communicating the determined parameters to an external device.

20. The method of providing verbal communication in a high voltage detection device of claim 11 wherein the control is battery powered.

* * * * *